(12) United States Patent
Coloma (10) Patent No.: US 7,352,275 B2
(45) Date of Patent: Apr. 1, 2008

(54) DEVICE FOR COMPARING TWO WORDS OF N BITS EACH

(75) Inventor: Bernard Coloma, Nantes (FR)

(73) Assignee: Atmel Nantes SA, Nantes Cedex (FR)

( * ) Notice: Subject to any disclaimer, the term of this patent is extended or adjusted under 35 U.S.C. 154(b) by 0 days.

(21) Appl. No.: 10/563,661

(22) PCT Filed: Jul. 6, 2004

(86) PCT No.: PCT/FR2004/001758

§ 371 (c)(1),
(2), (4) Date: Jun. 5, 2006

(87) PCT Pub. No.: WO2005/006557

PCT Pub. Date: Jan. 20, 2005

(65) Prior Publication Data

US 2006/0267739 A1    Nov. 30, 2006

(30) Foreign Application Priority Data

Jul. 8, 2003    (FR) .................................. 03 08360

(51) Int. Cl.
G05B 1/00    (2006.01)
(52) U.S. Cl. ................................. 340/146.2
(58) Field of Classification Search .................. 326/52, 326/54, 55
See application file for complete search history.

(56) References Cited

U.S. PATENT DOCUMENTS

| 5,400,007 | A | * | 3/1995 | McClure ................... 340/146.2 |
| 5,630,160 | A | * | 5/1997 | Simpson et al. ............ 708/490 |
| 5,742,224 | A | * | 4/1998 | Gadducci et al. ......... 340/146.2 |
| 5,781,465 | A | * | 7/1998 | Lutz et al. .................. 708/671 |
| 5,986,538 | A | * | 11/1999 | Yoon ....................... 340/146.2 |
| 6,014,074 | A |   | 1/2000 | Park ........................ 340/146.2 |
| 6,255,856 | B1 | * | 7/2001 | Oh .............................. 326/113 |
| 2002/0083108 | A1 |   | 6/2002 | Tierno ........................ 708/671 |

FOREIGN PATENT DOCUMENTS

EP    0 939 490 A2    9/1999

OTHER PUBLICATIONS

English Translation of the International Preliminary Report on Patentability, Written Opinion of the International Searching Authority for PCT/FR2004/001758 filed Jul. 6, 2004.

* cited by examiner

*Primary Examiner*—Tuan T. Lam
(74) *Attorney, Agent, or Firm*—Westman, Champlin & Kelly (57) ABSTRACT

The disclosure relates to a device for comparing two words, N and P, of n bits each. The device includes at least one comparator block comprising n basic comparator blocks which can each be used to compare bits Ni and Pi of digit place i of words N and P, whereby $0 \leq i \leq n-1$. Moreover, each basic comparator block comprises: a first sub-block which can be used to generate a first signal indicating whether or not bits Ni and Pi are equal, said signal being generated at the output of the sub-block forming a first output (OUT_XORi) of the basic comparator block; a second sub-block which can be used to generate a second signal indicating which enables the second signal to pass to a second output (SOUTi) of the basic comparator block if the first signal indicates that bits Ni and Pi are not equal and which, in the opposite case, enables the second signal to be blocked. The comparator block also comprises: means for generating a third signal at a first output (OUT_XOR4_b) of the comparator block, indicating that numbers N and P are equal if the n first signals indicate same; and first selective passage means which can be used selectively to connect the second output (SOUTi) of a basic comparator block to a second output (OUT_COMP4) of the comparator block, whereby said basic comparator block, from among the basic comparator blocks having a second signal at the output thereof, processes the most significant bits. The signal present at the second output of the comparator block indicates which of the numbers, N or P, is greater.

18 Claims, 4 Drawing Sheets

DEVICE FOR COMPARING TWO WORDS OF N BITS EACH

CROSS-REFERENCE TO RELATED APPLICATION

This Application is a Section 371 National Stage Application of International Application No. PCT/FR2004/001758, filed Jul. 6, 2004 and published as WO 2005/006557 A1 on Jan. 20, 2005, not in English.

FIELD OF DISCLOSURE

The disclosure relates to a device for comparing two words (bus) N and P of n bits each. It can in particular, but not exclusively, be produced in the form of an MOS-transistor circuit.

The comparator according to the disclosure can be used in any type of circuit requiring a comparison of two n-bit buses.

BACKGROUND OF THE DISCLOSURE

Conventionally, the comparison of two words is performed with a carry-propagation subtractor. The subtraction is performed bit-by-bit. The carry occurs in a bit-by-bit sequence.

A disadvantage of this known solution is that the number of word bits to be compared is high, and the subtraction takes time.

Another disadvantage of this known solution is that it is slow and requires a large number of transistors.

The use of a parallel subtractor to reduce the carry-propagation time has also been proposed. The disadvantage of this alternative is that it considerably increases the complexity of the circuit, i.e. the number of transistors.

SUMMARY OF THE INVENTION

An aim of one or more embodiments of the invention is in particular to overcome these various disadvantages of the prior art.

More specifically, one or more embodiments of this invention provide a device for rapid comparison.

Another aim of one or more embodiments of the invention is to provide a comparison device that is adjustable and consistently efficient regardless of the number of word bits to be compared.

An additional aim of one or more embodiments of the invention is to provide an efficient device that does not require a large number of transistors. For example, an embodiment of the invention comprises a device for comparing two words N and P of n bits each, which device includes at least one level-1 comparator block which itself includes:

n basic comparator blocks, each enabling the bits Ni and Pi of position i of words N and P to be compared, with i being between 0 and n-1, and each including:
  a first sub-block for generating at its output, forming a first output (OUT_XORi) of the basic comparator block, a first signal indicating whether or not the bits Ni and Pi are equal;
  a second sub-block enabling a second signal, indicating which of the bits Ni and Pi is greater, to be generated at its output;
  a third sub-block enabling the second signal to pass to a second output (SOUTi) of the basic comparator block, if the first signal does not indicate an equality of the bits Ni and Pi, and otherwise enabling the second signal to be blocked;

means for generating a third signal at a first output (OUT_XOR4_b) of the level-1 comparator block, indicating that the numbers N and P are equal if the n first signals indicate that the n bits Ni and the n bits Pi are equal, and otherwise indicating that the numbers N and P are not equal;

first selective passage means enabling the second output (SOUTi) of a basic comparator block to be selectively connected to a second output (OUT_COMP4) of the level-1 comparator block, which basic comparator block, from among the basic comparator blocks having a second signal at their second output, processes higher-order bits, with the signal present at the second output of the level-1 comparator block indicating which of the numbers N and P is greater.

An embodiment of the invention therefore includes the use not of subtraction means but only comparison means. Indeed, each basic comparator block provides two signals used by the level-1 comparator block: one indicating the equality or inequality of the two bits, and the other indicating which of the two bits is greater. Similarly, each level-1 comparator block provides two signals: one indicating the equality or inequality of the two groups of bits, and the other indicating which of the two groups of bits is greater.

As explained below, in a specific embodiment of the invention, the signals provided by a plurality of level-1 comparator blocks are used by a level-2 comparator block. More generally, it is possible to provide several levels of comparator blocks: each level-k-1 comparator block providing two signals intended to be used by a comparator block of level k: one indicating the equality or inequality of the two groups of bits, and the other indicating which of the two groups of bit is greater.

For two words of n bits, the calculation principle is as follows: starting from the high orders, when a bit Pi (with i between 0 and n-1) is different from a bit Ni (with i between 0 and n-1) then one of the two numbers is greater than the other. Thus, if Ni is equal to 1 and Pi to 0, then N is greater than P; otherwise, if Pi is equal to 1 and Ni is equal to 0, then P is greater than N.

The originality of an embodiment of the invention lies in the use of a basic structure (basic comparator block) containing few transistors and allowing for a very short propagation time. This structure will be repeated n times and interconnected by specific means so as to form a b-bit (level-1) comparator block. As explained below, in a preferred embodiment of the invention, several level-1 comparator blocks can function very rapidly, simultaneously and entirely autonomously, connected to one another by specific means, thus enabling words with a large number of bits to be compared.

Advantageously, the first sub-block includes an "exclusive-OR" gate receiving the bits Ni and Pi at the input.

The second sub-block advantageously includes an "OR" gate receiving the bit Pi at the input and, via an inverter, the bit Ni.

The third sub-block advantageously includes a "selective passage" gate of which the input is connected to the output of the second sub-block and which is controlled by the output of the first sub-block.

According to an advantageous feature, the means for generating the third signal, at the first output of the level-1 comparator block, include an "OR" gate of which the inputs are connected to the first outputs of the basic comparator blocks.

Preferably, the first selective passage means include:

means for directly connecting the second output of the basic comparator block processing the high-order bits Nn−1 and Pn−1 to the second output of the level-1 comparator block;

for each of the other basic comparator blocks processing bits Nj and Pj, with j being between 0 and n−2, means for connecting the second output of the basic comparator block to the second output of the level-1 comparator block, via a "selective passage" gate controlled by the output of an "OR" gate of which the inputs are connected to the first outputs of the basic comparator blocks of higher order than j.

In an advantageous embodiment of the invention, said at least one level-1 comparator block also includes means for storing the value present at the second output of the level-1 comparator block.

Preferably, the storage means include:

a "NON OR" gate of which a first input is connected to the second output of the level-1 comparator block and a second input is connected, via an inverter, to the first output of the level-1 comparator block;

a low-current inverter connecting the output of said "NOT OR" gate to the first input of said "NOT OR" gate.

In a specific embodiment of the invention, the device includes at least one level-2 comparator block which itself includes:

q level-1 comparator blocks, with $q \leq 2$, each including a portion of the n basic comparator blocks;

means for generating a fourth signal at a first output of the level-2 comparator block, indicating that the numbers N and P are equal if the first outputs of the q level-2 comparator blocks indicate that the bits that they compare are equal, and otherwise indicating that the numbers N and P are not equal;

second selective passage means, enabling the second output of a level-1 comparator block to be selectively connected to a second output of the level-2 comparator block, which level-1 comparator block, from among the level-1 comparator blocks having a second signal at their second output, processes higher-order bits, with the signal present at the second output of the level-2 comparator block indicating which of the numbers N and P is greater.

Thus, to improve the processing speed, a parallel comparison mode is used. To compare two words of n bits, N and P, the comparator is broken down into a plurality of level-1 comparator blocks functioning in parallel. The partitioning can be performed on blocks with a maximum of 4 bits, but also on blocks of 2 bits, 3 bits, 5 bits or more. The partitioning by 4 is more advantageous in terms of the number of transistors and the speed for buses of format 8, 16, 32, 40 and so on.

The means for generating the fourth signal, at the first output of the level-2 comparator block, advantageously include an "OR" gate of which the outputs are connected to the first outputs of the level-1 comparator blocks.

Advantageously, the second selective passage means include:

means enabling the second output of the level-1 comparator block processing the high-order bits to be connected to the second output of the level-2 comparator block, via a "selective passage" gate controlled by the first output of the level-1 comparator block processing the high-order bits;

for each of the other level-1 comparator blocks, means for connecting the second output of the level-1 comparator block to the second output of the level-2 comparator block, via a "selective passage" gate controlled by the output of an "OR" gate of which one input is connected, via an inverter, to the first output of said level-1 comparator block, and of which the other inputs are connected to the first outputs of the higher-order level-1 comparator blocks.

Said at least one level-2 comparator block advantageously also includes means for storing the present value at the second output of the level-2 comparator block.

According to an advantageous feature, the storage means include:

a "NOT OR" gate of which a first input is connected to he second output of the level-2 comparator block and a second input is connected, via an inverter, to the first output of the level-2 comparator block;

a low-current inverter connecting the output of said "NOT OR" gate to the first input of said "NOT OR" gate.

In a specific embodiment of the invention, the device includes at least one level-k comparator block, with $k \geq 2$, which itself includes:

p level-k-1 comparator blocks, with $p \geq 2$;

means for generating a fifth signal at a first output of the level-k comparator block, indicating that the numbers N and P are equal if the first outputs of p level-k-1 comparator blocks indicate that the bits that they are comparing are equal, and otherwise indicating that the numbers N and P are not equal;

third selective passage means, enabling the second output of a level-k-1 comparator block to be selectively connected to a second output of the level-k comparator block, which level-k-1 comparator block, from among the level-k-1 comparator blocks having a signal at their second output, processes higher-order bits, with the signal present at the second output of the level-k comparator block indicating which of the numbers N and P is greater.

Advantageously, each "selective passage" gate includes a transistor N mounted parallel with respect to a transistor P.

According to an advantageous feature, the device is produced in the form of a wired circuit.

Other features and advantages of one or more embodiments of the invention will appear in the following description of a preferred embodiment of the invention, given as an indicative and non-limiting example, and the appended drawings.

DETAILED DESCRIPTION OF ILLUSTRATIVE EMBODIMENTS

Figure 1:
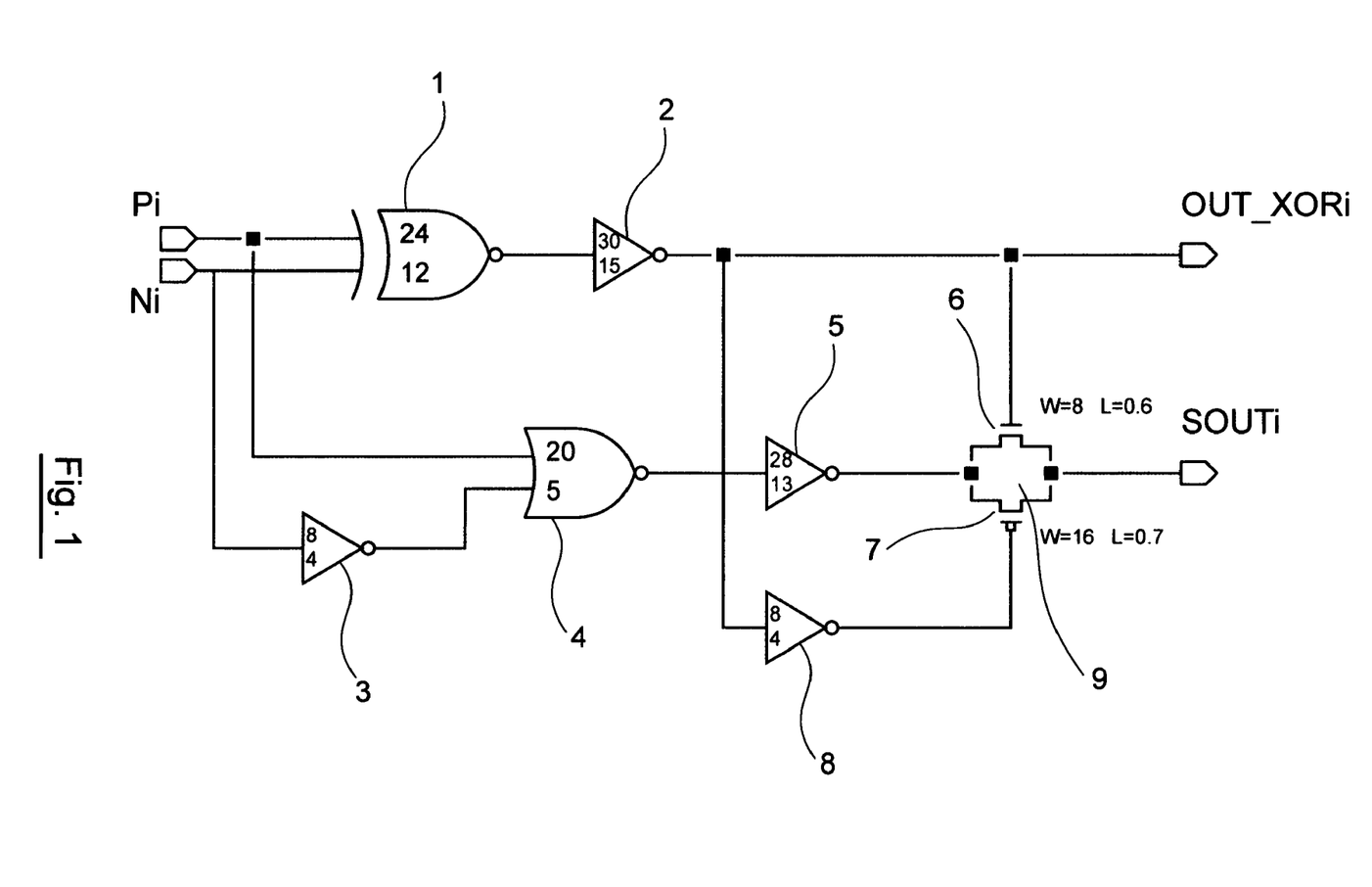
FIG. 1 shows a diagram of a basic comparator block (1-bit comparator block), included in an 8-bit comparator according to a specific embodiment of the invention.

Now, in reference to FIG. 1, a basic comparator block (1-bit comparator block) will be described.

This block receives, at the input, two bits Ni and Pi to be compared (bits of position i of words N and P). It has two outputs: one (OUT_XORi) indicates whether the two bits Ni and Pi are equal, the other (SOUTi) indicates which of the two bits Ni and Pi is greater.

It includes:

a first sub-block including an "exclusive-OR" (XOR) gate, receiving, at the input, the bits Ni and Pi and of which the output constitutes the first output OUT_XORi of the 1-bit comparator block. This XOR gate itself consists of a "not-exclusive-OR" (NXOR) gate 1 followed by an inverter 2;

a second sub-block including an "OR" gate receiving, at the input, the bit Pi and, via an inverter 2, the bit Ni. This OR gate itself consists of a "not-OR" gate 4 followed by an inverter 5;

a third sub-block including a selective passage gate ("pass-gate") 9 of which the input is connected to the output of the second sub-block (i.e. the reference inverter 5) and of which the output constitutes the second output SOUTi of the 1-bit comparator. This selective passage gate is controlled by the first output OUT_XORi of the 1-bit comparator unit. Indeed, it includes a transistor N 6 mounted parallel with respect to a transistor P 7, which are activated by the first output OUT_XORi, directly or via an inverter 8, respectively.

Now, the operation of this 1-bit comparator block will be described in detail. The first sub-block 1, 2 makes it possible to determine whether the two bits (Ni and Pi) are equal or not. Next, the pass-gate 9, controlled by the output of the first sub-block 1, 2 (exclusive-OR) enables the result of the comparison to be transmitted if Ni is different fro Pi or the output signal SOUTi to be put in high impedance (pass-gate blocked for Ni equal to Pi). Thus, when:

Ni=Pi, then OUT_XORi=0 and SOUTi is HZ (high impedance);
Pi=and Ni=0 then OUT_XORi=1 and SOUTi=1;
Pi=0 and Ni=1 then OUT_XORi=1 and SOUTi=0.

Now, in reference to FIG. 2, a level-1 comparator block (4-bit comparator block) will be described.

This block receives, at the input, a 4-bit input bus N (N3, N2, N1, N0) and a 4-bit input bus P, with N and P being 4-bit words to be compared.

It has three outputs:

the output OUT_XOR4_b, which is active at 0 and indicates whether the two 4-bit numbers are equal;

the output OUT_XOR4, which is the inverse of the output OUT_XOR4_b. It is therefore active at 1 and indicates whether the two 4-bit numbers are equal;

the output OUT_COMP4, which indicates the result of the comparison of the two 4-bit numbers (i.e. which of the two is greater).

It includes:

four 1-bit comparator blocks referenced 21 to 24;
three "not-OR" (NOR) gates referenced 25 to 27;
four inverters referenced 28 to 211;
three selective pass-gates referenced 212 to 214.

The NOR gate referenced 25 and the inverter referenced 28 which follows it together form an "OR" gate, receiving, at the input, the outputs OUT_XORi of the four 1-bit comparator blocks. The output of this OR gate constitutes the output OUT_XOR4_b of the 4-bit comparator block.

The output OUT-XOR4 of the 4-bit comparator block corresponds directly to the output of the NOR gate referenced 25.

The output SOUTi of the 1-bit comparator block referenced 21, which processes the high-order bits N3 and P3, is connected directly to the output OUT_COMP4 of the 4-bit comparator.

The output SOUTi of each of the other 1-bit comparator blocks referenced 22 to 24, which process bits Nj and Pj (with j between 0 and n-2), is connected to the output OUT_COMP4 of the 4-bit comparator block, via one of the "selective passage" gates 212 to 214. Each of these "selective passage" gates is controlled by an "OR" (performed with one of the NOR gates 26, 27 and the inverters 29, 210 which follow it, or by the only inverter referenced 211) of the outputs OUT_XORi of the higher-order 1-bit comparator blocks.

Now, the operation of this 4-bit comparator block will be described in detail. Starting with the high orders, when the output OUT_XORi of a 1-bit comparator block is different from 0, i.e. a bit Pi is different from a bit Ni, then one of the two numbers N and P is greater than the other. At this time, the comparison is concluded. It can be detected according to the value of SOUTi (of the 1-bit comparator block of which the output OUT_XORi is different from 0) which of the two numbers N and P is greater. It is therefore unnecessary to take into account the next 1-bit comparison blocks (of lower order). It is even necessary to block their outputs (which would distort the comparison). For this, it is necessary to block the pass-gates 212 to 214 connecting the outputs SOUTi of the 1-bit comparators of lower-order to the output OUT_COMP4. These pass-gates are controlled by an OR of the outputs OUT_XORi of the 1-bit comparator blocks of higher-order. Thus, starting from the high orders, when an output OUT_XORi of a 1-bit comparator block is equal to 1, it positions at 0 all of the outputs of the NOR gates connected to the outputs OUT_XORi of lower-order. The outputs of the NOR gates thus block the pass-gates connecting the output SOUTi of the lower-order 1-bit comparators to the output OUT_COMP4.

When the four bits of N are identical to the four bits of P, the two numbers of four bits are identical. An OR of the four outputs OUT_XORi of the four 1-bit comparators enables the signal OUT_XOR4_b to be generated. The signal OUT_XOR4_b is equal to 0 when the 2 numbers are equal. The signal OUT_XOR4 is the inverse of OUT_XOR4_b.

Figure 3:
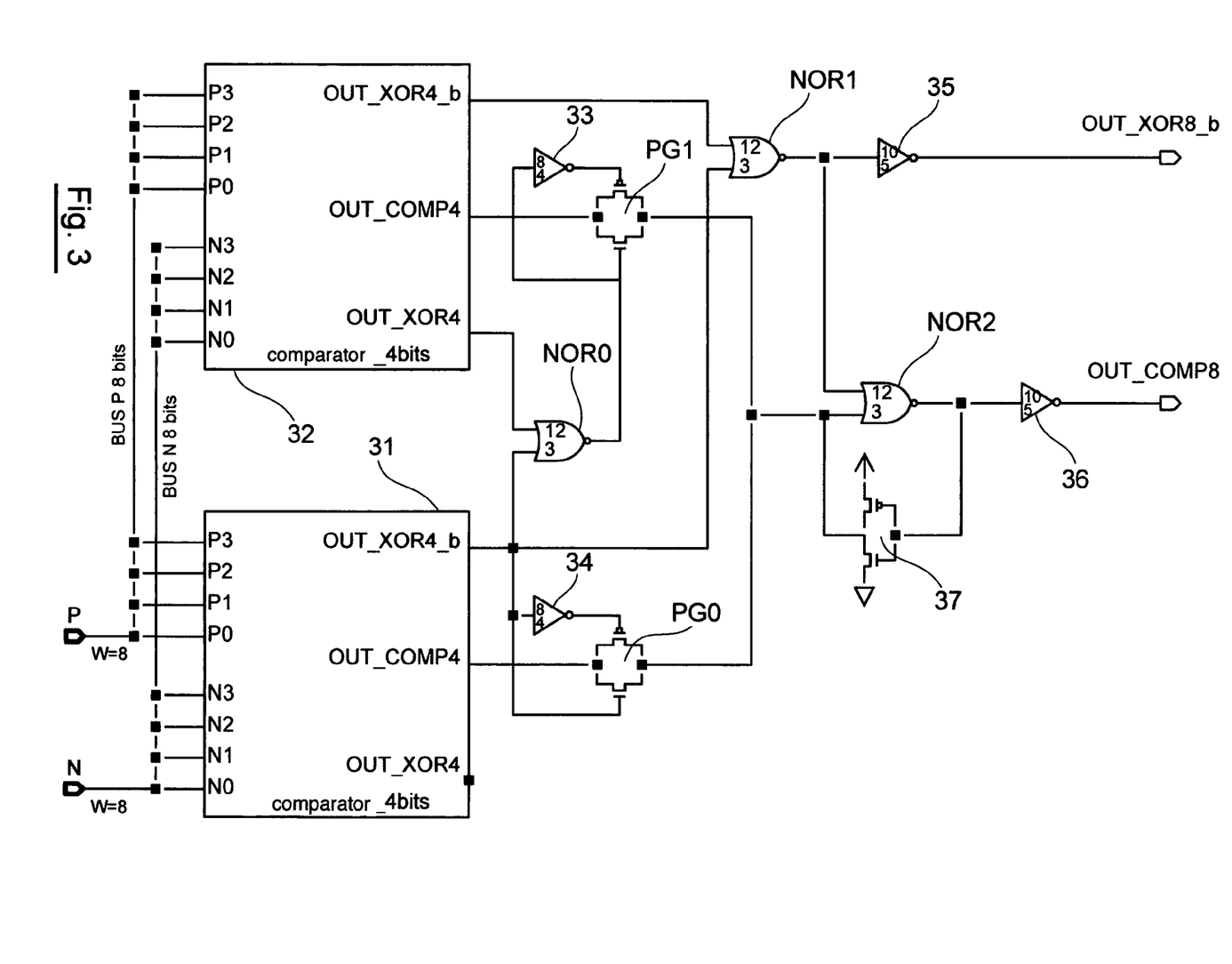
FIG. 3 shows a diagram of an 8-bit comparator according to a specific embodiment of the invention.

Now, in reference to FIG. 3, an 8-bit comparator block will be described.

This block receives, at the input, an 8-bit input bus N and an 8-bit input but P, with N and P being 8-bit words to be compared.

It has two outputs:

the output OUT_XOR8_b, which is active at 0 and indicates whether the two 8-bit numbers are equal;

the output OUT_COMP8, which indicates the result of the comparison of the two 8-bit numbers (i.e. which of the two is greater).

It includes:

two 4-bit comparator blocks referenced 31 and 32;
three NOR gates referenced NOR0, NOR1 and NOR2;
four inverters referenced 33 to 36;
two selective pass-gates referenced PG0 and PG1.

The NOR1 gate and the inverter referenced 35 which follows it together form an OR gate, receiving, at the input, the outputs OUT_XOR4_b of the two 4-bit comparator blocks. The output of this OR gate constitutes the output OUT_XOR8_b of the 8-bit comparator block.

The output OUT_COMP4 of the 4-bit comparator block referenced 31, which processes the high-order bits, is connected to the output OUT_COMP8 of the 8-bit comparator block via the selective passage gate PG0 (as well as via storage means constructed around the gate NOR2, as explained below). The selective passage gate PG0 is controlled by the output OUT_XOR4_b of the 4-bit comparator block referenced 31.

The output OUT_COMP4 of the other 4-bit comparator block referenced 32 is connected to the output OUT_COMP8 of the 8-bit comparator block, via the selective passage gate PG1 (as well as via storage means constructed around the gate NOR2, as explained below). The selective passage gate PG1 is controlled by a "not OR" (performed with the NOR0) of the output OUT_XOR4_b of the 4-bit comparator block referenced 31 and the output OUT_XOR4 of the 4-bit comparator block referenced 32.

Now, the operation of the 8-bit comparator block will be described in detail. Two 4-bit comparator blocks functioning in parallel are used. The first block 31 is connected to the four high-order bits of buses N and P. The second block 32 is connected to the low-order bits of buses N and P. Thus, the two blocks 31, 32 function entirely in parallel but the validation of the output of the low-order block 31 is dependent on the value of the output signal OUT_XOR4_b of the high-order block 32.

If the output_XOR4_b of the first 4-bit comparator block 31 is equal to 1, then one of the two 4-bit numbers is greater than the other. The value of the signal OUT_COMP4 of the first block 31 indicates which of the two numbers is greater. The pass-gate PG0 is then busy, while the pass gate PG1 is blocked by the gate NOR0. The signal OUT_COMP8 then gives the result of the 8-bit comparison (it is at 0 if N is greater than P).

If the output OUT_XOR4_b of the first 4-bit comparator block 31 is equal to 0, the four high-order bits are identical, and the result of the comparison is derived from the comparison of 4 high-order bits. Two cases are thus possible.

First case: if the signal OUT_XOR4_b of the second block 32 is equal to 0, then the two numbers are equal. In this case, the pass age PG0 is blocked by the signal OUT_XOR4_b of the first 4-bit comparator 31, while the pass-gate PG1 is blocked by NOR0. The input of NOR2 is forced to 1 by the output of NOR1, which is equal to 1 when the two signals OUT_XOR4_b (of the first and second 4-bit comparator blocks 31 and 32) are at 0. The output OUT_COMP8 is thus equal to 1, and, generally, the signal OUT_COMP8 is equal to 1 when N is lower than or equal to P. The output OUT_XOR8_b is then equal to 0. It is 0 each time the two numbers N and P are equal.

Second case: if the signal OUT_XOR4_b of the second block 32 is equal to 1, the two numbers are then different and the value of the signal OUT_COMP8 indicates which of the two numbers is greater (OUT_COMP8 is at 0 if N is greater than P). In this case, the input of NOR2 is at 0.

A small (low-current) inverter 37 looped back to NOR2 enables the value of the comparison to be stored at the end of the operation.

Figure 2:
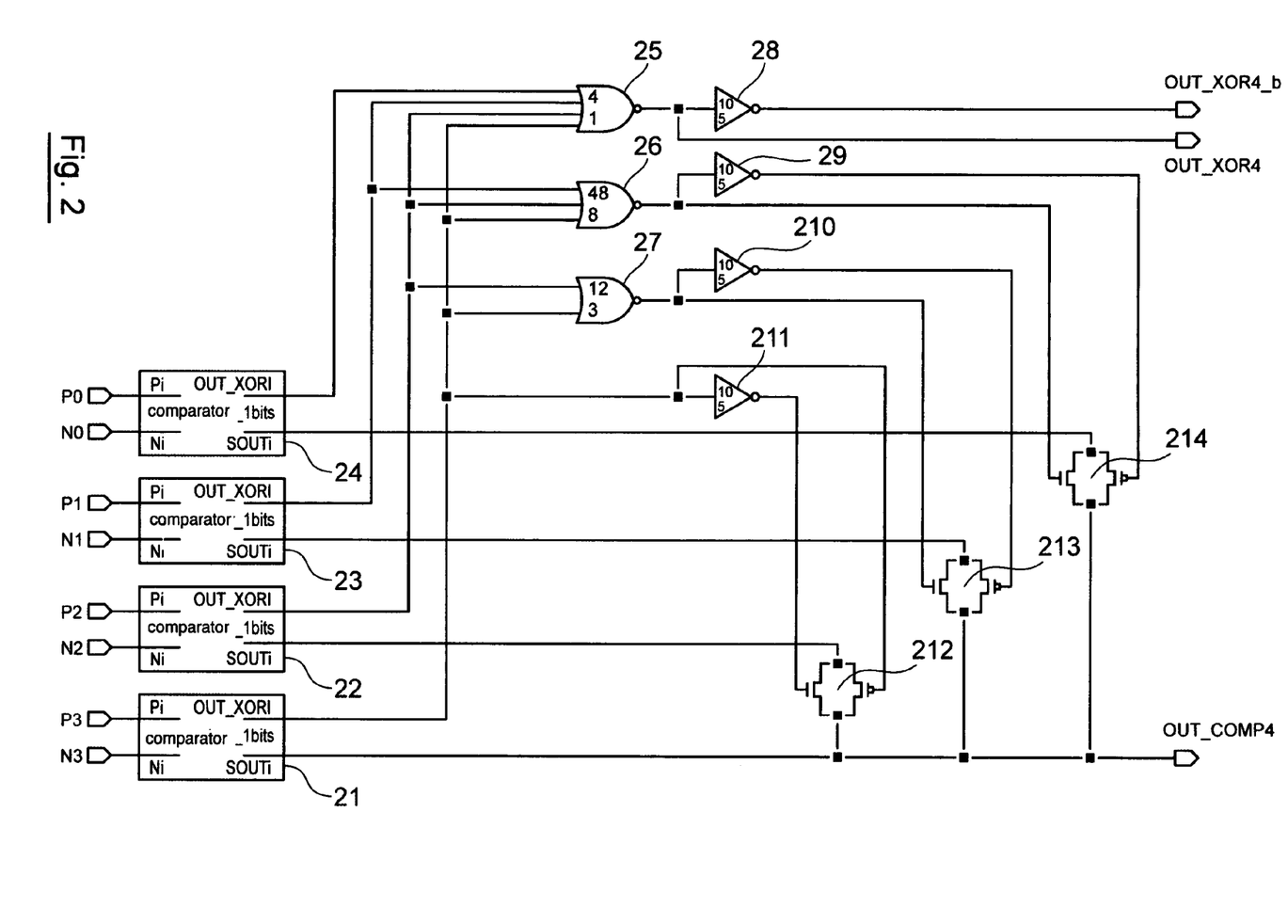
FIG. 2 shows a diagram of a level-1 comparator block (4-bit comparator), included in an 8-bit comparator according to a specific embodiment of the invention.
Figure 4:
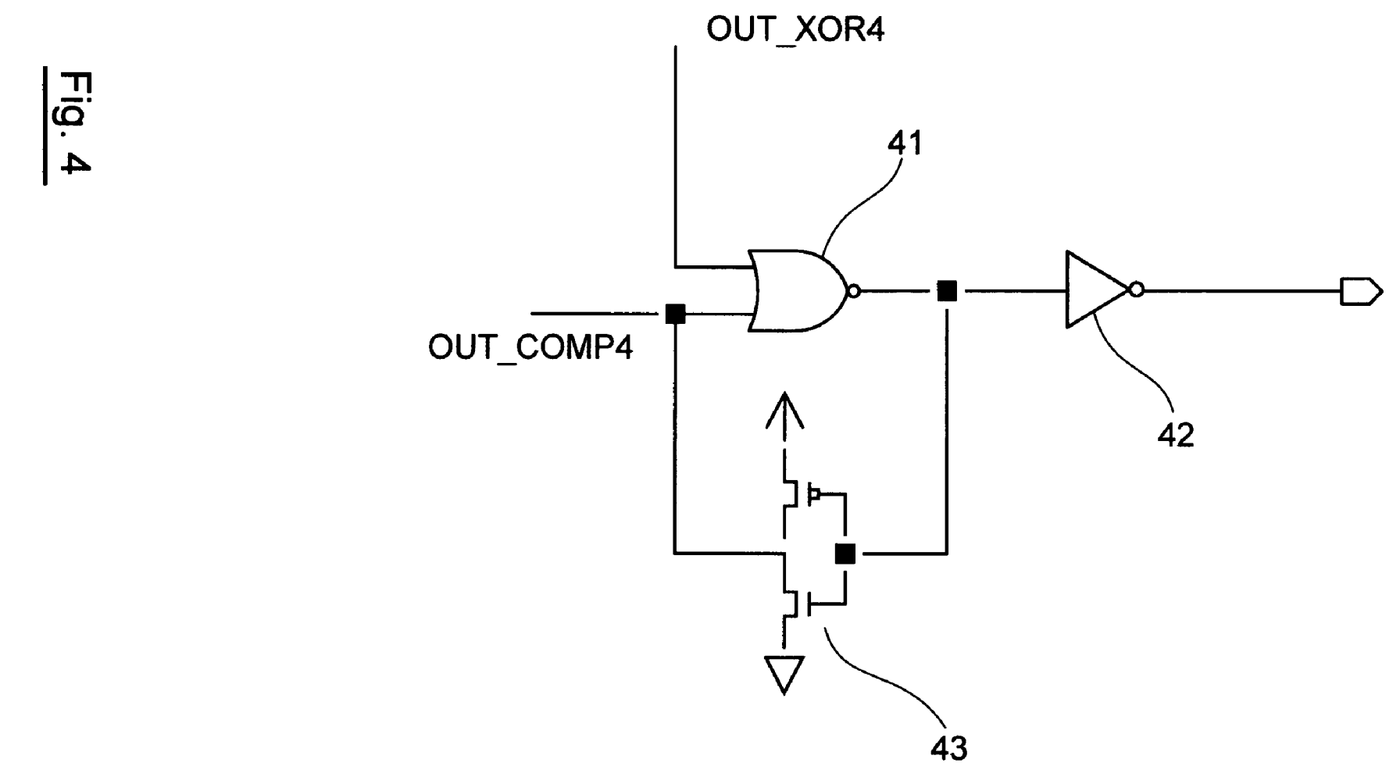
FIG. 4 shows (optional) means for storing the value present at the second output (OUT_COMP4) of the level-1 comparator block (4-bit comparator block) of FIG. 2.

As shown in FIG. 4, the 4-bit comparator block can include (optional) means for storing the value present at the second output (OUT_COMP4) of the level-1 comparator block (4-bit comparator block) of FIG. 2.

This is in particular the case when the 4-bit comparator block is used alone (and not in an 8-bit comparator block as described above in reference to FIG. 3).

An NOR gate 41 receives, at the input, the outputs OUT_COMP4 and OUT_XOR4 of the 4-bit comparator block. Its output is followed by an inverter 42. A small (low-current) inverter 43 looped back to the NOR gate 41 enables the value of the comparison to be stored at the end of the operation.

The invention claimed is:

1. Device for comparing two words N and P of n bits each, which includes at least one level-1 comparator block which itself includes:
   n basic comparator blocks, each enabling the bits Ni and Pi of position i of words N and P to be compared, with i being between 0 and n−1, and each including:
      a first sub-block for generating at its output, forming a first output of the basic comparator block, a first signal indicating whether or not the bits Ni and Pi are equal;
      a second sub-block enabling a second signal, indicating which of the bits Ni and Pi is greater, to be generated at its output; and
      a third sub-block enabling the second signal to pass to a second output of the basic comparator block, if the first signal does not indicate an equality of the bits Ni and Pi, and otherwise enabling the second signal to be blocked;
   means for generating a third signal at a first output of the level-1 comparator block, indicating that the numbers N and P are equal if the n first signals indicate that the n bits Ni and the n bits Pi are equal, and otherwise indicating that the numbers N and P are not equal; and
   first selective passage means enabling the second output of a basic comparator block to be selectively connected to a second output of the level-1 comparator block, which basic comparator block, from among the basic comparator blocks having a second signal at their second output, processes higher-order bits, with the signal present at the second output of the level-1 comparator block indicating which of the numbers N and P is greater.

2. Device according to claim 1, wherein the first sub-block includes an exclusive-OR gate receiving the bits Ni and Pi at the input.

3. Device according to claim 1, wherein the second sub-block includes an OR gate receiving, at an input thereof, the bit Pi and, via an inverter, the bit Ni.

4. Device according to claim 1, wherein the third sub-block includes a selective passage gate of which the input is connected to the output of the second sub-block and which is controlled by the output of the first sub-block.

5. Device according to claim 1, wherein the means for generating the third signal, at the first output of the level-1 comparator block, include an OR gate of which the inputs are connected to the first outputs of the basic comparator blocks.

6. Device according to claim 1, wherein the first selective passage means include:
   means enabling the second output of the basic comparator block processing the high-order bits Nn−1 and Pn−1 to be directly connected to the second output of the level-1 comparator block; and
   for each of the other basic comparator blocks processing Nj and Pj bits, with j being between 0 and n-2, means for connecting the second output of the basic comparator block to the second output of the level-1 comparator block, via a selective passage gate controlled by the output of an OR gate of which one inputs are connected to the first outputs of the basic comparator blocks of higher order than j.

7. Device according to claim 1, wherein said at least one level-1 comparator block also includes means for storing the value present at the second output of the level-1 comparator block.

8. Device according to claim 7, wherein the storage means include:
a NOT OR gate of which a first input is connected to the second output of the level-1 comparator block and a second input is connected, via an inverter, to the first output of the level-1 comparator block; and
a low-current inverter connecting the output of said NOT OR gate to the first input of said NOT OR gate.

9. Device according to claim 1, wherein the device includes at least one level-2 comparator block which itself includes:
q level-1 comparator blocks, with $q \geq 2$, each including a portion of the n basic comparator blocks;
means for generating a fourth signal at a first output of the level-2 comparator block, indicating that the numbers N and P are equal if the first outputs of the q level-1 comparator blocks indicate that the bits that they compare are equal, and otherwise indicating that the numbers N and P are not equal; and
second selective passage means, enabling the second output of a level-1 comparator block to be selectively connected to a second output of the level-2 comparator block, which level-1 comparator block, from among the level-1 comparator blocks having a second signal at their second output, processes higher-order bits, with the signal present at the second output of the level-2 comparator block indicating which of the numbers N and P is greater.

10. Device according to claim 9, wherein the means for generating the fourth signal, at the first output of the level-2 comparator block, include an OR gate of which the inputs are connected to the first outputs of the level-1 comparator blocks.

11. Device according to claim 9, wherein the second selective passage means include:
means enabling the second output of the level-1 comparator block processing the high-order bits to be connected to the second output of the level-2 comparator block, via a selective passage gate controlled by the first output of the level-1 comparator block processing the high-order bits; and
for each of the other level-1 comparator blocks, means for connecting the second output of the level-1 comparator block to the second output of the level-2 comparator block, via a selective passage gate controlled by the output of an OR gate of which one input is connected, via an inverter, to the first output of said level-1 comparator block, and of which the other inputs are connected to the first outputs of the higher-order level-1 comparator blocks.

12. Device according to claim 9, wherein said at least one level-2 comparator block also includes means for storing the value present at the second output of the level-2 comparator block.

13. Device according to claim 12, wherein the storage means include:
a NOT OR gate of which a first input is connected to the second output of the level-2 comparator block and a second input is connected, via an inverter, to the first output of the level-2 comparator block; and
a low-current inverter connecting the output of said NOT OR gate to the first input of said NOT OR gate.

14. Device according to claim 1, wherein the device includes at least one level-k comparator block, with $k \geq 2$ which itself includes:
p level-k-1 comparator blocks, with $p \geq 2$;
means for generating a fifth signal at a first output of the level-k comparator block, indicating that the numbers N and P are equal if the first outputs of p level-k-1 comparator blocks indicate that the bits that they are comparing are equal, and otherwise indicating that the numbers N and P are not equal; and
third selective passage means, enabling the second output of a level-k-1 comparator block to be selectively connected to a second output of the level-k comparator block, which level-k-1 comparator block, from among the level-k-1 comparator blocks having a signal at their second output, processes higher-order bits, with the signal present at the second output of the level-k comparator block indicating which of the numbers N and P is greater.

15. Device according to claim 1, wherein each selective passage means an N-Type transistor mounted parallel with respect to a P-Type transistor.

16. Device according to claim 1, wherein the device is produced in the form of a wired circuit.

17. Device for comparing two words N and P of n bits each, which includes at least one level-1 comparator block which itself includes:
n basic comparator blocks, each enabling the bits Ni and Pi of position i of words N and P to be compared, with i being between 0 and n-1, and each including:
a first sub-block for generating at its output, forming a first output of the basic comparator block, a first signal indicating whether or not the bits Ni and Pi are equal;
a second sub-block enabling a second signal, indicating which of the bits Ni and Pi is greater, to be generated at its output; and
a third sub-block enabling the second signal to pass to a second output of the basic comparator block, if the first signal does not indicate an equality of the bits Ni and Pi, and otherwise enabling the second signal to be blocked;
a circuit which generates a third signal at a first output of the level-1 comparator block, indicating that the numbers N and P are equal if the n first signals indicate that the n bits Ni and the n bits Pi are equal, and otherwise indicating that the numbers N and P are not equal; and
a first selective passage gate enabling the second output of a basic comparator block to be selectively connected to a second output of the level-1 comparator block, which basic comparator block, from among the basic comparator blocks having a second signal at their second output, processes higher-order bits, with the signal present at the second output of the level-1 comparator block indicating which of the numbers N and P is greater.

18. A method of comparing two words N and P of n bits each, the method comprising:
comparing the bits Ni and Pi of position i of words N and P, with i being between 0 and n-1, which comprises for each bit i:
generating at a first output a first signal indicating whether or not the bits Ni and Pi are equal;

generating a second signal indicating which of the bits $N_i$ and $P_i$ is greater; and passing the second signal to a second output if the first signal does not indicate an equality of the bits $N_i$ and $P_i$, and otherwise blocking the second signal from being passed to the second output;

generating a third signal at a first comparator output indicating that the numbers N and P are equal if the n first signals indicate that the n bits $N_i$ and the n bits $P_i$ are equal, and otherwise indicating that the numbers N and P are not equal; and selectively passing the second signals that are passed to respective second outputs to a second comparator output so as to indicate which of the numbers N and P is greater.

* * * * *